United States Patent [19]
Cini et al.

[11] Patent Number: 5,165,590
[45] Date of Patent: Nov. 24, 1992

[54] PROCESS FOR MANUFACTURING INTEGRATED DEVICE WITH IMPROVED CONNECTIONS BETWEEN THE PINS AND THE SEMICONDUCTOR MATERIAL CHIP

[75] Inventors: Carlo Cini, Cornaredo; Angelo Massironi, Concorezzo; Luigi Sisti, Genova, all of Italy

[73] Assignee: SGS-Thomson Microelectronics S.r.l., Agrate Brianza, Italy

[21] Appl. No.: 867,646

[22] Filed: Apr. 13, 1992

Related U.S. Application Data

[62] Division of Ser. No. 583,271, Sep. 17, 1990, Pat. No. 5,113,239.

[30] Foreign Application Priority Data

Sep. 21, 1989 [IT] Italy .................. 21783 A/89

[51] Int. Cl.[5] .................... B23K 20/10; B23K 101/40
[52] U.S. Cl. ..................... 228/175; 228/179; 228/111
[58] Field of Search ............... 228/175, 110, 111, 179

[56] References Cited

U.S. PATENT DOCUMENTS

| 4,458,297 | 7/1984 | Stopper et al. | 361/403 |
| 4,818,895 | 4/1989 | Kaufman | 307/303.1 |
| 4,942,455 | 7/1990 | Shinohara | 357/70 |

FOREIGN PATENT DOCUMENTS

| 0178170 | 4/1986 | European Pat. Off. | 228/179 |
| 54-34678 | 3/1979 | Japan | 228/111 |

Primary Examiner—Richard K. Seidel
Assistant Examiner—Jeanne M. Elpel
Attorney, Agent, or Firm—Guido Modiano; Albert Josif

[57] ABSTRACT

A process for manufacturing devices with improved connections between the pins and the semiconductor material chip which integrates electronic components. In order to allow the integration of signal components and power components in a same device with a reduced use of area for the soldering pads and with high reliability of the connections, the connecting wires are made of different materials. Advantageously, the wires for the power connections are based on aluminum and have large diameters, and the wires for the signal connections are gold-based and have a small diameter. In order to ensure good soldering, the ends of the pins on which the connecting wires are to be soldered are gold-plated.

6 Claims, 1 Drawing Sheet

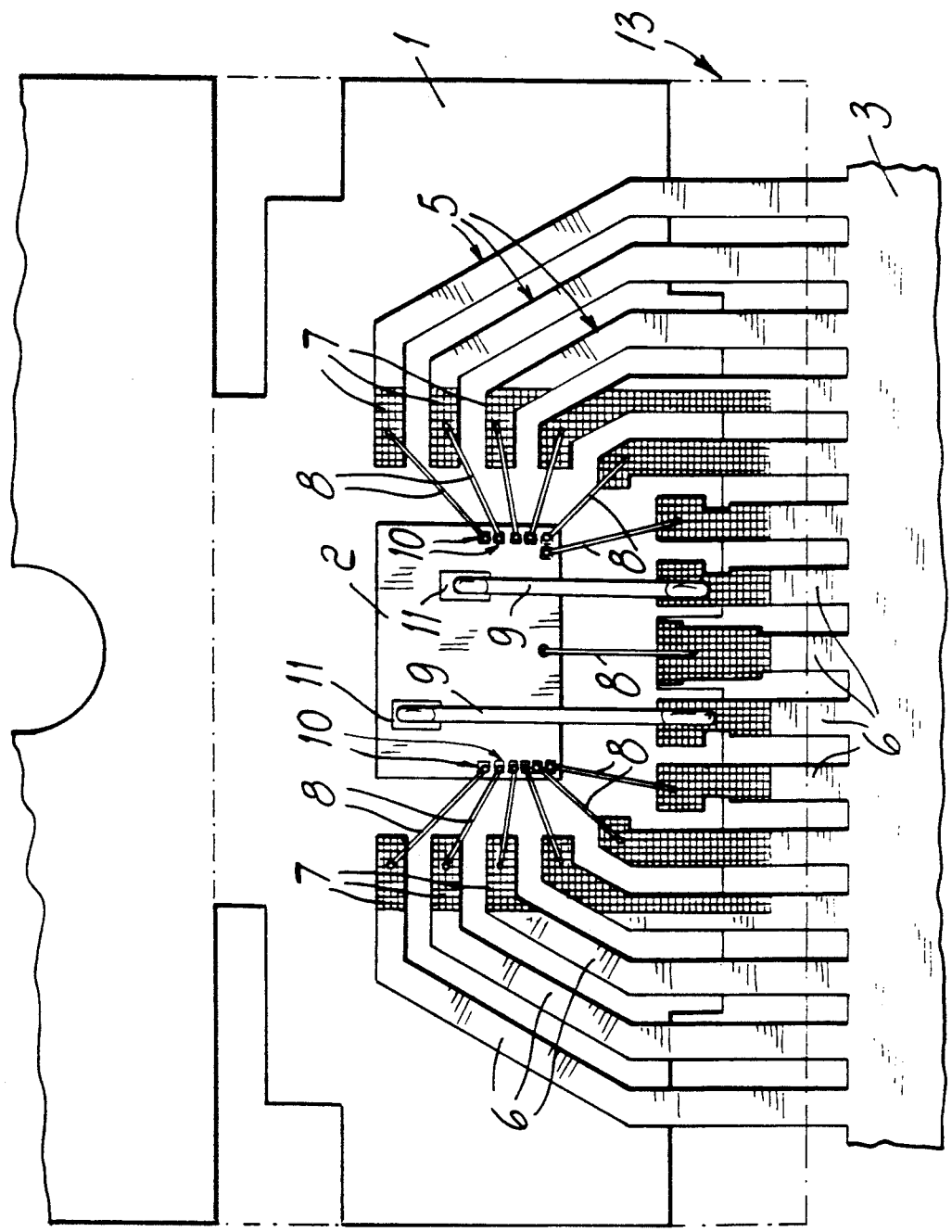

PROCESS FOR MANUFACTURING INTEGRATED DEVICE WITH IMPROVED CONNECTIONS BETWEEN THE PINS AND THE SEMICONDUCTOR MATERIAL CHIP

This is a division of application Ser. No. 07/583,271 filed Sep. 17, 1990, now U.S. Pat. No. 5,113,239.

BACKGROUND OF THE INVENTION

The present invention relates to a process for manufacturing integrated devices which have improved connections between the pins and the semiconductor material chip which integrates electronic components.

As is known, in integrated devices the semiconductor material chip which integrates electronic components is connected to the pins which protrude externally from the housing (package) of the device by means of wires which are soldered on appropriate pads of the chip at one end and to an end of the pins at the other.

It is also known that said wires are currently made of gold or aluminum (or of alloys with a prevalence of gold and aluminum). In particular, gold is the preferred material, by virtue of its characteristics of ductility, workability, conduction etc. which make it the most suitable for connections. However, gold wires cannot be used if they must carry high currents (power integrated circuits). As the current rises, it is in fact necessary to provide wires with a larger diameter, but gold wires with a diameter of more than 50 $\mu$m would have an excessively high cost.

Consequently, when the integrated device is a power type device and the wires (or at least some of them) must therefore be able to carry high currents, aluminum is used, since it is easily workable, ductile, has good conductivity etc. and allows the execution of wires with a larger diameter (e.g. 0.3-0.4 mm, which are able to carry a very high current density, equal to $10^6$ A/sq. cm.).

Consequently, when the integrated circuit comprises only low-power components (for "signal" control), gold wires are preferably used for the connections, whereas aluminum wires are used in the case of power integrated circuits.

The problems arise with integrated circuits in which a single device integrates both low-power "signal" components and power components. In this case the presence of power components prevents the use of gold wires, so that aluminum wires are currently used.

However, the use of aluminum for both power and signal connections is disadvantageous. Aluminum wires in fact require larger soldering areas with respect to gold, since the soldering technique used for aluminum ("wedge" soldering) requires a larger area than the technique used for gold on the chip ("ball" soldering). Consequently, in the case of integration of both power and signal components in the same device, wires of different diameters are used. However, aluminum wires cannot be produced with small dimensions as is instead possible with gold. Thin aluminum in fact is not sufficiently ductile and breaks easily, so that attempts made with small-diameter (2 mil) aluminum wires have been found to be scarcely reliable.

Consequently, the devices in which aluminum wires of different diameters depending on the currents to be conducted are provided require in any case large areas on the chip for the execution of contact pads with dimensions adequate for the diameter of the wires used and to the soldering technique employed. The problem affects in particular integrated devices which have a large number of pins, in which chips with large surfaces must currently be provided in order to have enough room for the soldering of the connections. Another disadvantage of this technique is the need to use different soldering machines according to the diameter of the wire to be soldered.

It is also known to provide connections formed by a plurality of wires arranged in parallel "multi-wire" technique). By means of this technique it is possible to use gold wires for the conduction of higher currents (the maximum current density is in fact the sum of the current densities of the individual wires connected in parallel). However, even this solution is not free from disadvantages which are linked to the high consumption of wire and most of all to the scarce possibilities of checking the efficiency of multiple-wire connections. Current tests are in fact incapable of distinguishing "good" parts, in which all the wires of each connection are present and unbroken, from defective parts in which one or more wires are missing or in which some wires are weakened (have a reduced cross section). In particular, connections with more than three wires have been found to be impossible to check. It has furthermore been observed that if one of the wires of a connection is broken the other wires of the same connection are also more easily subject to breakage. Due to this reason, when high reliability is required, this technique is generally applied with two, at the most three wires per connection.

SUMMARY OF THE INVENTION

Given this situation, the aim of the present invention is to provide a process for manufacturing integrated devices with improved connections between the pins and the semiconductor material chip which integrates electronic components, which solves the disadvantages of the known art and in particular does not require large soldering areas on the chip.

Within the scope of this aim, a particular object of the present invention is to provide connections for integrated circuits which have high reliability and verifiability.

Not least object of the present invention is to provide connections for integrated circuits which require, for their manufacture, the use of devices or procedures which are already in use in the electronics industry.

This aim, these objects and others which will become apparent hereinafter are achieved by a process for manufacturing integrated devices with improved connections between the pins and the semiconductor material chip which integrates electronic components as defined in the accompanying claims.

In practice, the invention proposes the use of different materials and in particular the use of different diameters for the signal connections and for the power connections. Preferably, according to the invention, the power connections are provided by means of low-cost wires (pure aluminum or Al alloys, such as for example Al/Mg) of adequate diameter (7, 10, 15 mil), whereas the signal connections are provided by means of wires of material normally used for signal connections (gold or alloys of gold with prevalence of gold) with a small diameter (between 1 and 2 mil).

This solution has entailed numerous problems as regards the use of soldering devices and the galvanized finishing of the connecting pins, so that they are suitable for both aluminum and gold wires.

In particular as regards the devices and methods for soldering, after numerous experiments and studies, the Applicant has opted for soldering machines ("bonders") specialized for the type of wire used, and specifically, "thermosonic" technology machines have been used for gold wires, whereas "ultrasonic"-technology machines have been used for aluminum wires.

The use of connecting wires made of different materials has entailed specific solutions as regards the finishing of the plating of the pins. The solutions known and used so far in the case of wires made of a same metal (plating of the pins with deoxidized Cu, chemical Ni, electrolytic Ni, "full" and/or "spot" Ag) have proved to be unsuitable in the case of use of wires of different material due to incompatibility with one or the other of the materials of the wires.

A gold plating which is compatible with both metals has consequently been chosen. However, even this plating has entailed problems. The part of the pins which protrudes from the package of the finished device (and which is normally tin-plated) in fact cannot be gold-plated, since gold leaves undesirable contaminating residues during the sound-wave bath for the soldering of the pins to the printed circuit. The gold-plating of the entire surface of the pins and of the supporting portions thereof (which are eliminated after the closure of the packages) furthermore entails significant costs.

Therefore, according to the invention, the pins are selectively gold-plated; specifically, the internal parts intended to be enclosed in the package are gold-plated, so that the gold plating remains inside the package after its closure. This selective plating is performed prior to the mechanical connection between the lead frame and the chip supporting slag. In particular, the plating is performed electrolytically by means of plastic protection masks which cover the parts which are not to be gold-plated. In any case the invention applies both to devices with non-planar lead frame and to devices with planar lead frame.

The Applicant has developed two possible procedures for the gold-plating of the pins. The lead frame is initially degreased by immersion in a sodium hydrate bath and is then washed, and the material is revived in a bath of hydrochloric acid. Then, according to a first procedure, the lead frame is coated with a very thin layer of copper by immersion in a bath (copper flashing), is then coated with a thin layer of nickel (1 $\mu$m) and is then plated with electrolytic gold (0.6 $\mu$m gold flashing). According to a second solution, after reviving, the nickel coating is performed first, followed by the copper coating and by the gold plating. The thickness of the layers can also vary within a wide range, for example thicknesses comprised between 0.1 and 3 $\mu$m for nickel and between 0.4 and 2.5 $\mu$m for gold have yielded good results.

The devices executed according to the invention have been subjected to reliability tests. Said tests have been performed on both assembled and encapsulated units and on assembled and non-encapsulated units and have yielded excellent results. In particular, 336-hour tests at PPT (Pressure Pot Temperature) on assembled and non-encapsulated units have shown no deviations with respect to the results of pull tests yielded prior to the PPT tests.

BRIEF DESCRIPTION OF THE DRAWINGS

The characteristics and advantages of the invention will become apparent from the description of a preferred embodiment, illustrated only by way of non-limitative example in the accompanying drawings, wherein the only figure is a top view of an integrated device before the application of the container at the end of the soldering operation.

DESCRIPTION OF THE PREFERRED EMBODIMENTS

In particular, in the figure the reference numeral 1 indicates the supporting slag of the chip 2, which is already mechanically fixed to the lead frame 3, of which only a part is shown in the figure and supports the pins 5 related to the illustrated chip 2 (15 pins in the illustrated case). As can be seen, the pins 5 are divided into a portion 6, which is plated in a conventional manner and is therefore tin-plated, and into a gold-plated portion 7, as indicated schematically in the figure by the shading.

In the example illustrated in the figure, 13 connections out of 15 are used for the signal and have therefore been provided by means of thin gold wires 8, whereas the remaining two connections are power connections and are therefore provided by means of thicker aluminum wire 9. The figure also illustrates the contact pads 10 for the signal and the contact pads 11 for the power. As can be seen, the pads 11 are considerably larger than the pads 10.

In the figure, the dot-and-dash line 13 indicates the contour of the package, which as can be seen is intended to completely surround the gold-plated part 7 of the pins, which therefore cannot be accessed outside the package, at the end of assembly.

As can be seen from the above description, the invention fully achieves the proposed aim and objects. By virtue of the use of wires made of different materials, the space required for soldering said wires on the chip is in fact reduced, and the use of different diameters for the different materials, and specifically thin gold wires for the signal and thick aluminum wires for the power, furthermore allows a substantial reduction in the area of the soldering pads with respect to the case in which only aluminum wires are used.

By way of example, consider a device with five pins, of which three are signal pins and two are power pins. Since for example a 10-mil diameter aluminum wire requires a pad of 870 square mil, whereas a 2-mil gold wire requires a pad of only 68 square mils, a device of the indicated type would require 4350 square mils in the case of five 10-mil aluminum wires, whereas a device executed according to the invention with three 2-mil gold wires and two 10-mil aluminum wires requires 1944 square mils. In this case, according to the invention, a saving of 2406 square mils (i.e. over 50%) is therefore obtained. This advantage, as is evident, becomes very important as the number of pins of the device rises, and can entail significant reductions in the dimensions of the device and therefore in the device manufacturing costs. It is consequently possible to fully exploit the advantages offered by the current trend toward miniaturization of the devices, which were practically eliminated by the large areas currently required for soldering.

The solution according to the invention is furthermore completely reliable. In particular, it is no longer necessary to provide connections formed by many wires each, or in any case, by means of the invention the "multi-wire" technique can be limited to the use of only two wires in parallel (which correspond to a maximum current of 5 A, by providing the connections which must carry higher currents in aluminum), and this still allows safe discrimination between unbroken connections and defective ones, without thus compromising the reliability of the interconnections.

Though more complex soldering and finishing techniques are required with the invention with respect to the case of the use of homogeneous materials for the wires of a device, it has been observed that the advantages linked to the dimensional reduction and to the high reliability abundantly compensate the disadvantages.

The invention thus conceived is susceptible to numerous modifications and variations, all of which are within the scope of the inventive concept. In particular, the fact is stressed that though reference to gold and aluminum wires has been made in the description, the invention also relates to the alloys of said metals. Other materials (such as for example copper, which is currently being studied) can furthermore also be considered for the execution of the connections between the chip and the pins of integrated devices according to the invention, if they are considered suitable for the purpose and their use is considered advantageous.

All the details may furthermore be replaced with other technically equivalent ones.

We claim:

1. Process for the manufacture of integrated devices, comprising the steps of:

selectively gold-plating device pins; and wire soldering for the execution of connections between a semiconductor material chip and the pins, wherein said wire soldering step includes:

soldering wires made of at least a first material comprising aluminium or alloys with a prevalence of aluminium for providing the chip power connections; and soldering wires made of at least a second material comprising gold or alloys with prevalence of gold for providing the chip signal connections.

2. Process according to claim 1, wherein the wires comprising gold or alloys with prevalence or gold are soldered with a thermosonic method and the aluminium or aluminim-based alloy wires are soldered with an ultrasonic method.

3. Process according to claim 2, wherein plating is performed galvanically, using protection masks suitable for covering at least the outer ends of the pins, such as to leave uncovered selected portions of said pins.

4. Process according to claim 3, wherein the internal parts of the pins intended to be enclosed in a package are gold-plated, so that the gold plating remains inside the package after its closure.

5. Process according to claim 3, wherein said step of selectively gold-plating of the device pins includes:

degreasing by immersion said pins in a sodium hydrate bath;

washing said pins;

reviving said pins in a bath of hydrochloric acid;

coating said pins with a very thin layer of copper by immersion in a bath;

coating said pins with a thin layer of nickel; and plating said pins with electrolytic gold.

6. Process according to claim 3, wherein said step of selectively gold-plating the device pins includes:

degreasing by immersion said pins in a sodium hydrate bath;

washing said pins;

reviving said pins in a bath of hydrochloric acid;

coating said pins with a thin layer of nickel;

coating said pins with a very thin layer of copper by immersion in a bath;

plating said pins with electrolytic gold.

* * * * *